United States Patent [19]
Isa

[11] Patent Number: 6,094,381
[45] Date of Patent: Jul. 25, 2000

[54] SEMICONDUCTOR MEMORY DEVICE WITH REDUNDANCY CIRCUIT

[75] Inventor: Satoshi Isa, Tokyo, Japan

[73] Assignee: NEC Corporation, Tokyo, Japan

[21] Appl. No.: 09/135,560

[22] Filed: Aug. 18, 1998

[30] Foreign Application Priority Data

Aug. 19, 1997  [JP]  Japan .................................. 9-222164

[51] Int. Cl.[7] .................................................. G11C 7/00
[52] U.S. Cl. .......................................... 365/200; 365/201
[58] Field of Search .................................. 365/200, 201, 365/225.7, 230.03, 230.06

[56] References Cited

U.S. PATENT DOCUMENTS

| | | | |
|---|---|---|---|
| 4,942,556 | 7/1990 | Sasaki et al. | 365/200 |
| 5,247,481 | 9/1993 | Conan | 365/200 |
| 5,801,986 | 9/1998 | Matsumoto et al. | 365/201 |
| 5,841,709 | 11/1998 | McClure | 365/200 |

Primary Examiner—Trong Phan
Attorney, Agent, or Firm—Sughrue, Mion, Zinn, Macpeak & Seas, PLLC

[57] ABSTRACT

A semiconductor memory device is provided which is capable of realizing a redundancy memory cell test to be performed before a defective memory cell is replaced by a redundancy memory cell with a small size circuit provided therein. The semiconductor memory device includes a redundancy address program circuit programmed such that a redundancy memory cell is selected when an address for selecting a defective memory cell, for generating a redundancy selection signal, and a circuit for receiving a redundancy circuit test mode signal which is made active when the redundancy memory cell is tested before the redundancy address program circuit is programmed to generate a portion of the input address as a portion of the address of the redundancy memory cell when the redundancy circuit test mode signal is active and generate the redundancy selection signal as a portion of the address of the redundancy memory cell when the redundancy circuit test mode signal is inactive.

6 Claims, 15 Drawing Sheets

| RXTE | L | |
|---|---|---|
| ACTIVE LEVEL XRD No. | RXDS0 | RXDS1 |
| 0 | L | L |
| 1 | H | L |
| 2 | L | H |
| 3 | H | H |

| RXTE | H | | | |
|---|---|---|---|---|
| XA2 | XA3 | RXDS0 | RXDS1 |
| L | L | L | L |
| H | L | H | L |
| L | H | L | H |
| H | H | H | H |

| RXTE | L | | |
|---|---|---|---|
| ACTIVE LEVEL XRD No. | RMWL No. | RMWL SET | RRS |
| 0 | 0 | 0,1 | L |
| 1 | 0 | 2,3 | H |
| 2 | 1 | 0,1 | L |
| 3 | 1 | 2,3 | H |
| 4 | 2 | 0,1 | L |
| 5 | 2 | 2,3 | H |
| 6 | 3 | 0,1 | L |
| 7 | 3 | 2,3 | H |

| RXTE | H | | |
|---|---|---|---|
| ACTIVE LEVEL XRD No. | XA1 | RSWL SET | RRS |
| 0 | 0 | 0,1 | L |
| 1 | 1 | 2,3 | H |
| 2 | 0 | 0,1 | L |
| 3 | 1 | 2,3 | H |
| 4 | 0 | 0,1 | L |
| 5 | 1 | 2,3 | H |
| 6 | 0 | 0,1 | L |
| 7 | 1 | 2,3 | H |

SEMICONDUCTOR MEMORY DEVICE WITH REDUNDANCY CIRCUIT

BACKGROUND OF THE INVENTION

1. Field of the Invention

The present invention relates to a semiconductor memory device and, particularly, to a semiconductor memory device which has a redundancy circuit and is capable of performing a preliminary test of the redundancy circuit.

2. Description of the Related Art

With the recent tendency of miniaturization, high integration and large capacity of semiconductor memory device, it has been very difficult to obtain complete semiconductor memory devices having no defect. That is, almost all semiconductor memory devices include defective memory cell, defective word line and/or defective bit line. In order to ship such semiconductor memory device having defects as an acceptable semiconductor memory device, it is usual to provide a redundancy circuit within the semiconductor memory device.

A redundancy method using a fuse has been known as a remedy for defect of the semiconductor provided with the redundancy circuit. That is, a memory cell array of the semiconductor memory device is tested to investigate address or addresses containing defect or defects and, when an address containing defect is input, a fuse within a redundancy address program circuit is preliminarily cut off so that a redundancy memory cell array is selected and used. In such redundancy system, however, it is impossible to select the redundancy circuit unless the fuse is cut off. That is, it is impossible to preliminarily test the redundancy memory cell array. Therefore, the redundancy memory cell array can be tested only after the defective memory cell array is replaced by the redundancy memory cell array. Therefore, when it is found that there is a defect in the replaced redundancy memory cell array, the latter must be replaced inefficiently by another redundancy circuit. In view of this inefficiency, a method for preliminarily testing a redundancy memory cell array before the fuse in the redundancy address program circuit is cut off has been proposed in, for example, Japanese Patent Application Laid-open No. He 5-36297. In the proposed method, a redundancy memory cell array can be tested before a fuse is cut off by providing, in addition to a fuse for programming such that a redundancy memory cell array is selected and used, another fuse for a redundancy circuit test and a gate circuit, etc.

However, in the method disclosed in the Japanese Patent Application Laid-open No. He 5-36297, it is necessary to additionally provide a fuse and a gate, etc., in every redundancy address program circuit, resulting in that a chip area is increased. Therefore, a semiconductor memory device having a small chip area and having a redundancy circuit which can be tested preliminarily has been highly requested.

SUMMARY OF THE INVENTION

An object of the present invention is to provide a semiconductor memory device capable of preliminarily testing a redundancy circuit thereof without increasing a chip area thereof.

A semiconductor memory device according to the present invention is featured by comprising a redundancy address program circuit programmed such that a redundancy memory cell is selected when an address for selecting a defective memory cell is input to generate a redundancy selection signal and a circuit for receiving a redundancy circuit test mode signal which is made active at a redundancy memory cell array test before the redundancy address program circuit is programmed, for generating a portion of an input address as a portion of the redundancy memory cell address when the redundancy circuit test mode signal is active and for generating the redundancy selection signal as a portion of the redundancy memory cell address when the redundancy circuit test mode signal is inactive.

According to the semiconductor memory device according to the present invention, it is unnecessary to provide a circuit for redundancy circuit test in each redundancy address program circuit and, therefore, it is possible, with a small size circuit, to test a redundancy memory cell before a fuse is cut off.

BRIEF DESCRIPTION OF THE DRAWINGS

The above and other objects, advantages and features of the present invention will become more apparent from the following description taken in conjunction with the accompanying drawings, in which.

DESCRIPTION OF THE PREFERRED EMBODIMENTS

Figure 1:
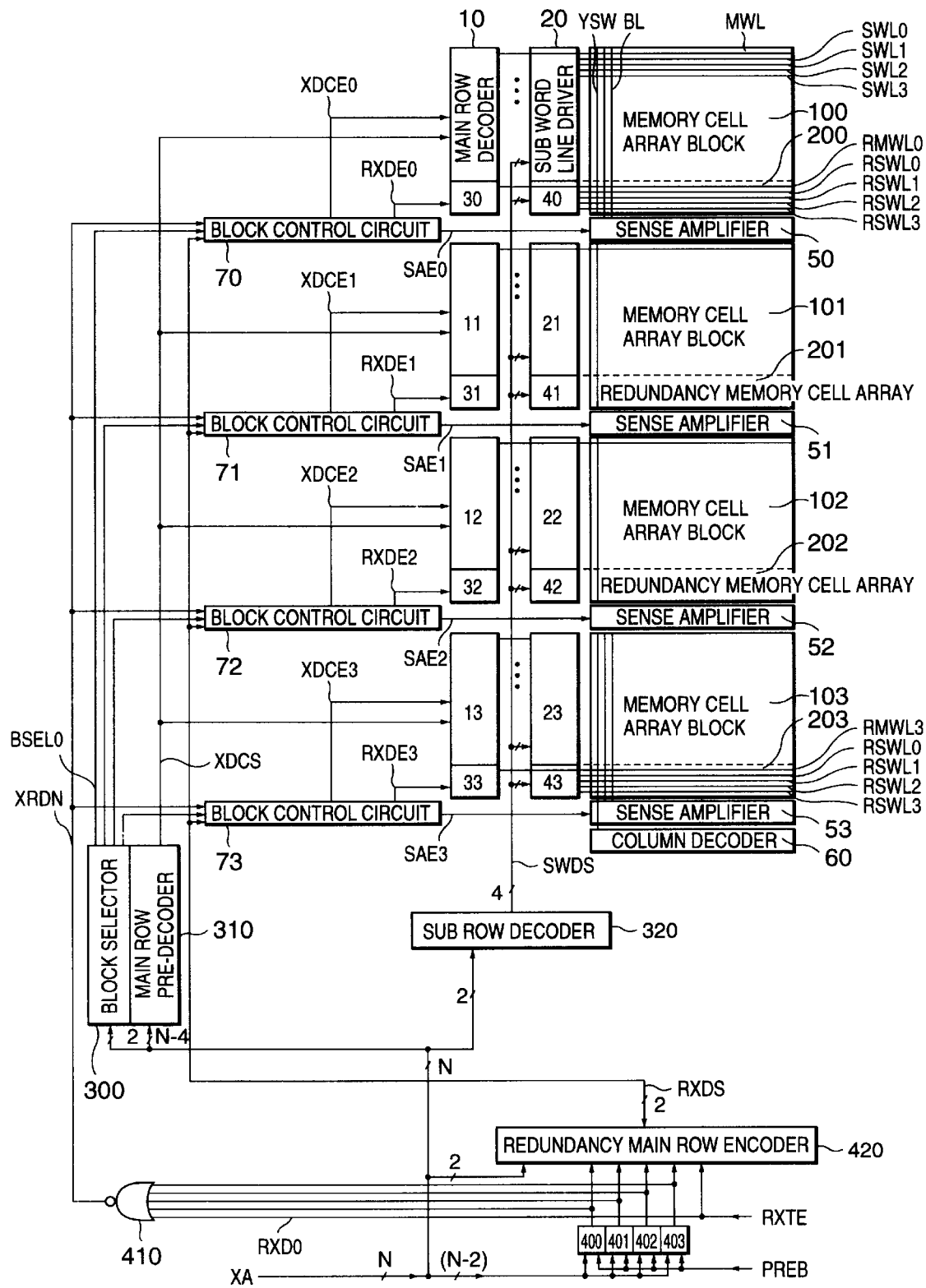
FIG. 1 is a block diagram showing a construction of a first embodiment of the present invention.

A first embodiment of the present invention will be described with reference to FIGS. 1 to 7 and 15. In FIG. 1 which is a block diagram showing a construction of a first embodiment of the present invention, four redundancy address program circuits 400 to 403 remedy for defects of memory cell array blocks 100 to 103. That is, the redundancy address program circuits are programmed such that, when there is a defect in any one of the memory array blocks 100 to 103, any one of the redundancy memory cell array 200 to 203 is selected with respect to an address containing the defect.

Incidentally, throughout the drawings, a triangle indicates an inverter, a circled transistor indicates a PMOS transistor and a transistor without circle indicates an NMOS transistor.

Figure 2:
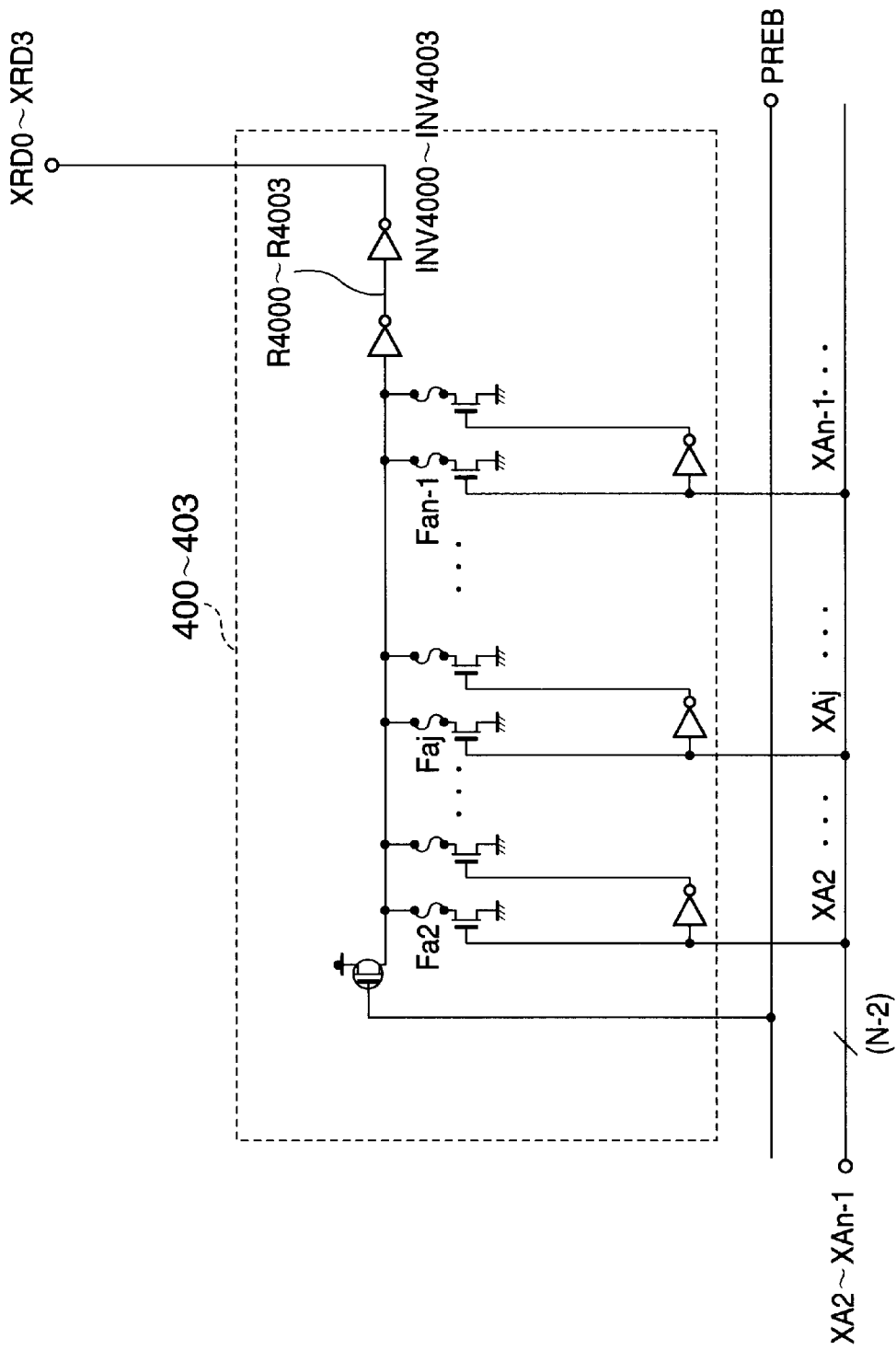
FIG. 2 is a circuit diagram showing a redundancy address program circuit of the first embodiment of the present invention.

A redundancy circuit test before fuses Fa2 to Fan-1 of the redundancy address program circuits 400 to 403 shown in FIG. 2 are cut off is performed as described below. A precharge signal PREB is in "low" state before address is determined and becomes "high" state immediately before address is determined. Since no fuse is cut off at a time of the redundancy circuit test, all of nodes R4000 to R4030 become "high" and all of redundancy selection signals XRD0 to XRD3 which are outputs of the redundancy address program circuits 400 to 403 become an inactive state, "low". Further, since a redundancy circuit test mode signal RXTE is "high", a redundancy judge signal XRDN from a redundancy judge circuit 410 shown in FIG. 1 becomes a redundancy state, "low". Therefore, all of main row decoders 10 to 13 become inactive by block control portions 70 to 73. On the other hand, redundancy main row encode signals RXDSO and RXDS1 determined by the correspondence table shown in FIG. 4(b) correspondingly to an input address (XA2, XA3) in the state of the redundancy circuit test mode signal RXTE is "high" are generated by a redundancy main row encoder 420 shown in FIG. 4(a). In a case where the input address (XA2, XA3) is, for example, (0,0), a "low" redundancy state of a redundancy judge signal XRDN and "low" states of the encode signals RXDS0 and RXDS1 from the redundancy main row encoder 420 are decoded by a decode portion RDE 700 of the block control circuit 70 which is shown in detail in FIG. 3 and both a redundancy main row decoder activation signal RXDE0 and a sense amplifier activation signal SAE0 become an active level, "high". With this fact, a redundancy main word line RMWL0 of the redundancy memory cell array 200 shown in FIG. 1 is selected. Detailed circuits of the block control circuits 71 to 73 are omitted since these circuits are different from that of the block control circuit 70 in only the construction of the decode portion RDE700 thereof. For example, the block control circuit 71 is constructed such that the sense amplifier activation signal SAE1 and the redundancy main row decoder activation signal RXDE1 become "high" when the redundancy main row encode signals RXDS0 and RXDS1 are "high" and "low", respectively.

Figure 5:
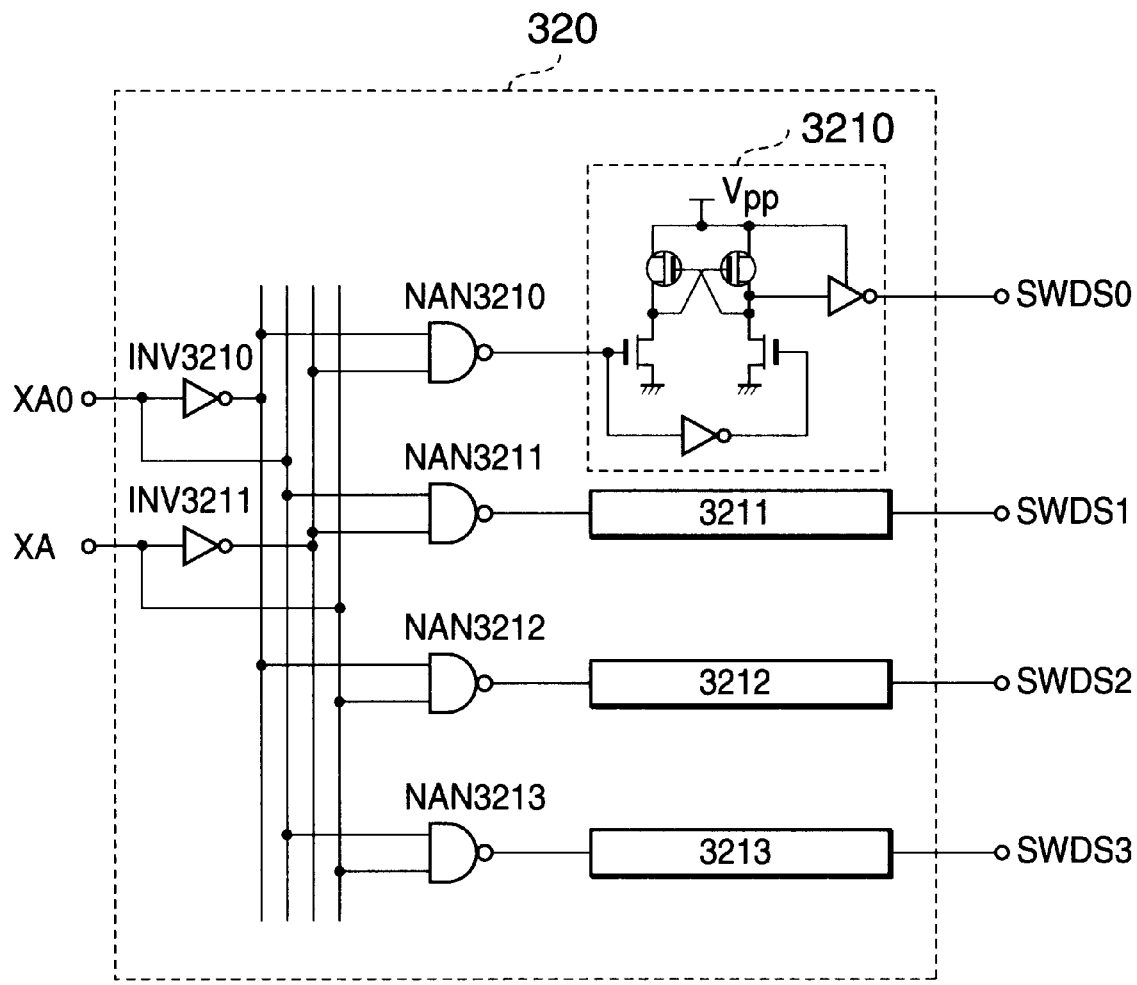
FIG. 5 is a circuit diagram showing a sub row decoder of the first embodiment of the present invention.
Figure 6:
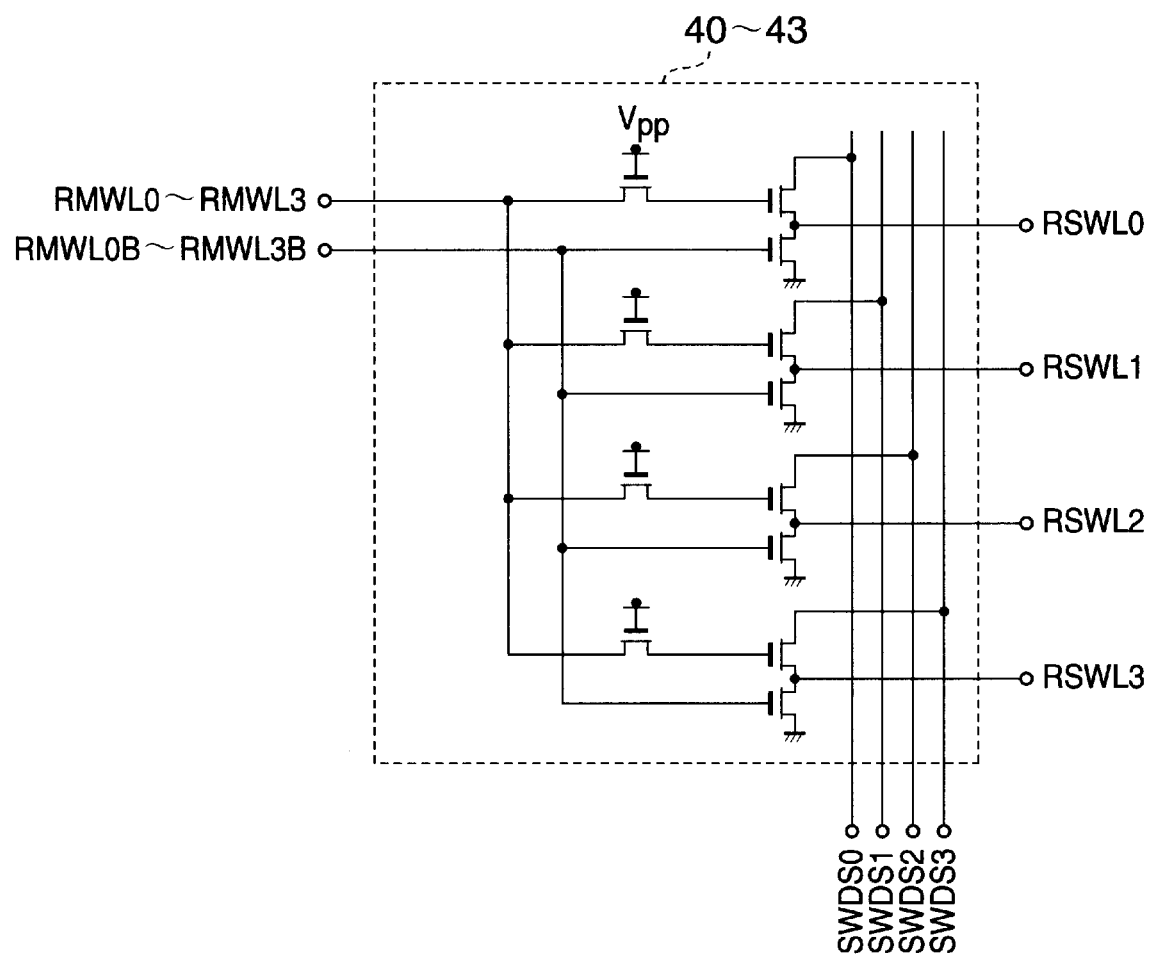
FIG. 6 is a circuit diagram showing a redundancy sub word line driver of the first embodiment of the present invention.

On the other hand, in a sub row decoder 320 whose detail is shown in FIG. 5, one of sub word line driver selection signals SWDS0 to SWDS3 becomes "high" in response to the least significant 2 bits (XA0,XA1) of the input address. Therefore, in the redundancy sub row driver 40 which is shown in detail in FIG. 6, one of the four redundancy main word lines RMWL0 to RMWL3 connected to the redundancy main word line RMWL0 which is in the active level is selected. In this example, one redundancy address program circuit performs a replacement of one main word line (4 sub word lines) as a unit. As mentioned above, it is possible to test all of the redundancy memory cell arrays 200 to 203 by changing the address (XA0 XA3) while keeping the redundancy circuit test mode signal RXTE in "high" level.

The redundancy memory cell array is tested by using the addresses (XA0 to XA3) since there are four redundancy memory cell array blocks in this embodiment. When there are eight redundancy memory cell array blocks for example, the test may be performed by using addresses (XA0 to XA4).

As described, in the semiconductor memory device according to the present invention, in which, when the redundancy circuit test mode signal is made active, a portion of the input address is used as the redundancy main row encode signal, it is possible to test the redundancy memory cell array by using a small size circuit.

An operation of this semiconductor memory device after some of the fuses are cut off when the redundancy circuit test mode signal RXTE is in "low" state will be described.

Figure 3:
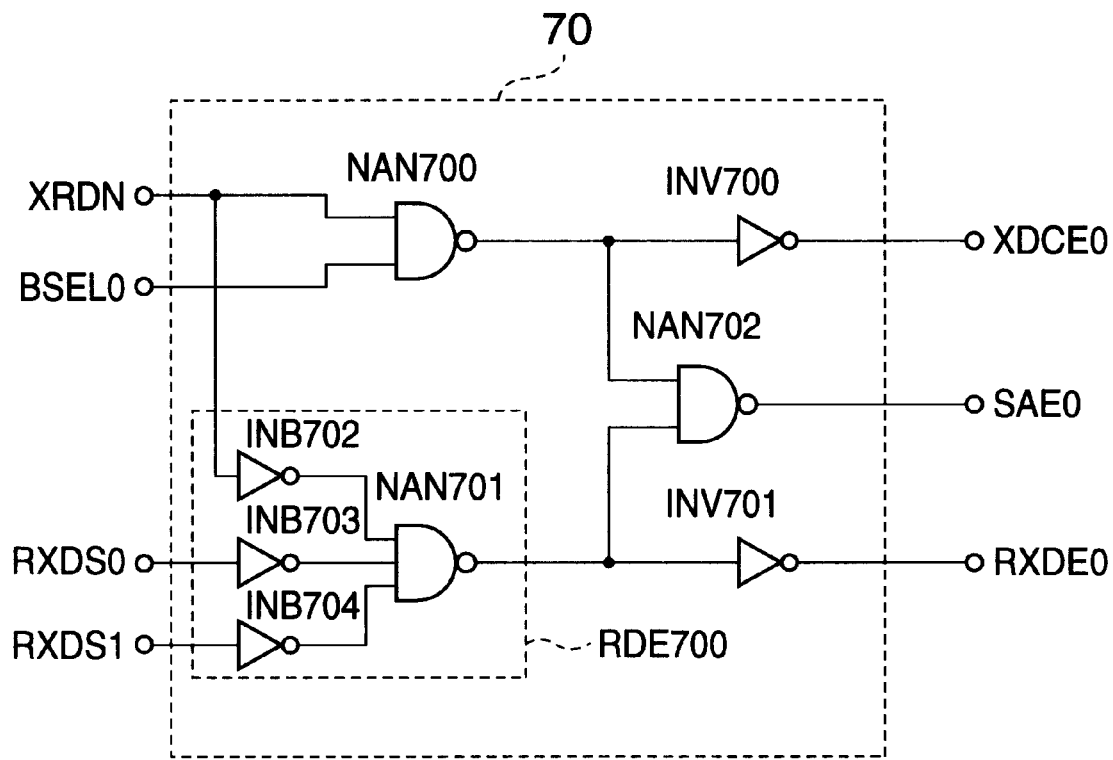
FIG. 3 is a circuit diagram showing a block control circuit in the first embodiment and a second embodiment of the present invention.
Figures 4A, 4B:
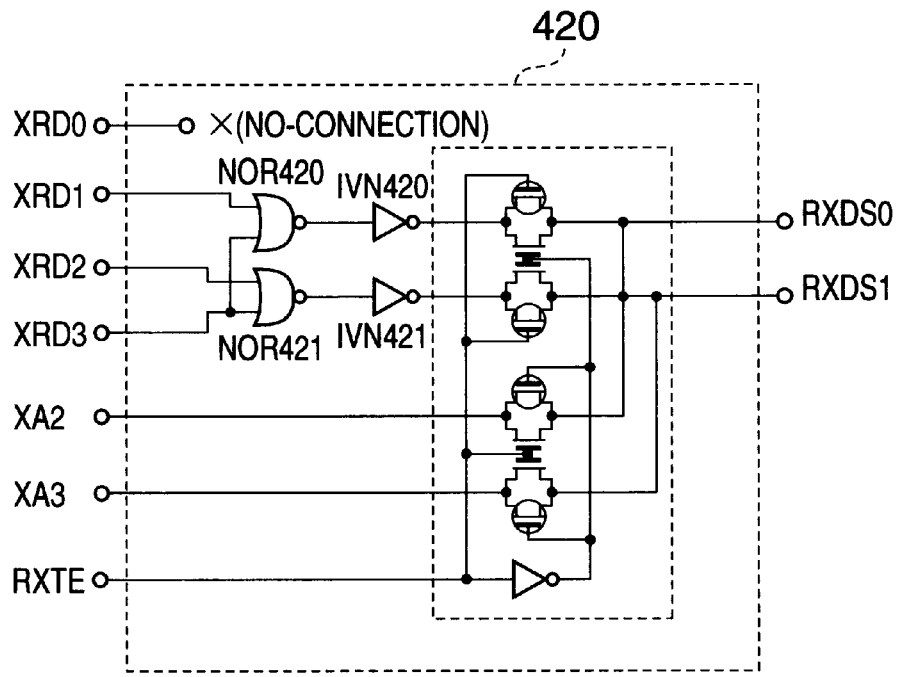
FIG. 4(a) is a circuit diagram of a redundancy main row encoder in the first embodiment of the present invention.
FIG. 4(b) shows signal correspondence tables of the redundancy main row encoder in the first embodiment of the present invention.

Since, when an address other than a address programmed by the cut-off of the fuse is input, all of the nodes R4000 to R4030 of the redundancy address program circuits 400 to 403 each shown in FIG. 2 become "high", all of the redundancy selection signals XRD0 to XRD3 from the redundancy address program circuits 400 to 403 become the inactive level, "low". Therefore, all of the redundancy main row decoder activation signals RXDE0 to RXDE3 of the block control circuits 70 to 73 become the inactive level, "low", since the output signal XRDN from the redundancy judge circuit 410 is kept in "high" which is a usual state. On the other hand, one of output signals BSEL0 to BSEL3 from a block selector 300 becomes active level "high" in response to the most significant 2 bits (XAn-2 and XAn-1) of the input address. For example, when the block selection signal BSEL0 is in the active level, "high", the block control circuits 70 shown in FIG. 3 is selected and the main row decoder activation signal XDCE0 and the sense amplifier activation signal SAE0 are activated and one main word line MWL is selected by the main row decoder 10 in response to the input address (XA2~XAn-3). Further, in response to the input address (X0,X1), one of the sub word lines is selected by the sub row decoder 320 shown in FIG. 5 and the sub word line driver 20 shown in FIG. 15 to select a usual memory cell array.

A case where a preliminarily programmed address to one of the redundancy address program circuits 400~407 is input will be considered. For example, it is assumed that the address programmed to the redundancy address program circuit 400 is input. In such case, the node R4000 in the redundancy address program circuit 400 becomes "low" and the redundancy selection signal XRD0 of the redundancy address program circuit 400 becomes the active level, "high". Therefore, the redundancy judge signal XRDN from the redundancy judge circuit 410 becomes the redundancy state, "low", and all of the main row decoders 10 to 13 becomes inactive state by the block control portions 70 to 73 as in the case where the redundancy circuit test mode signal RXTE is in the active level, "high". On the other hand, the redundancy main row encode signals RXDS0 and RXDS1 determined by the redundancy main row encoder shown in FIG. 4(a), according the correspondence table shown in FIG. 4(b) with the redundancy circuit test mode signal RXTE being "low". Since the redundancy selection signal RXD0 is in "high" level, both the redundancy main row encode signals RXDS0 and RXDS becomes "low". The operation after the above is omitted since it is similar to that in the case where the redundancy circuit test mode signal is in the active, "low", level.

As described, in the usual operation, the signal which is not a portion of the input signal and is determined by the redundancy selection signal can be made as the redundancy main row encode signal by making the redundancy circuit test mode signal RXTE inactive.

Figure 7:
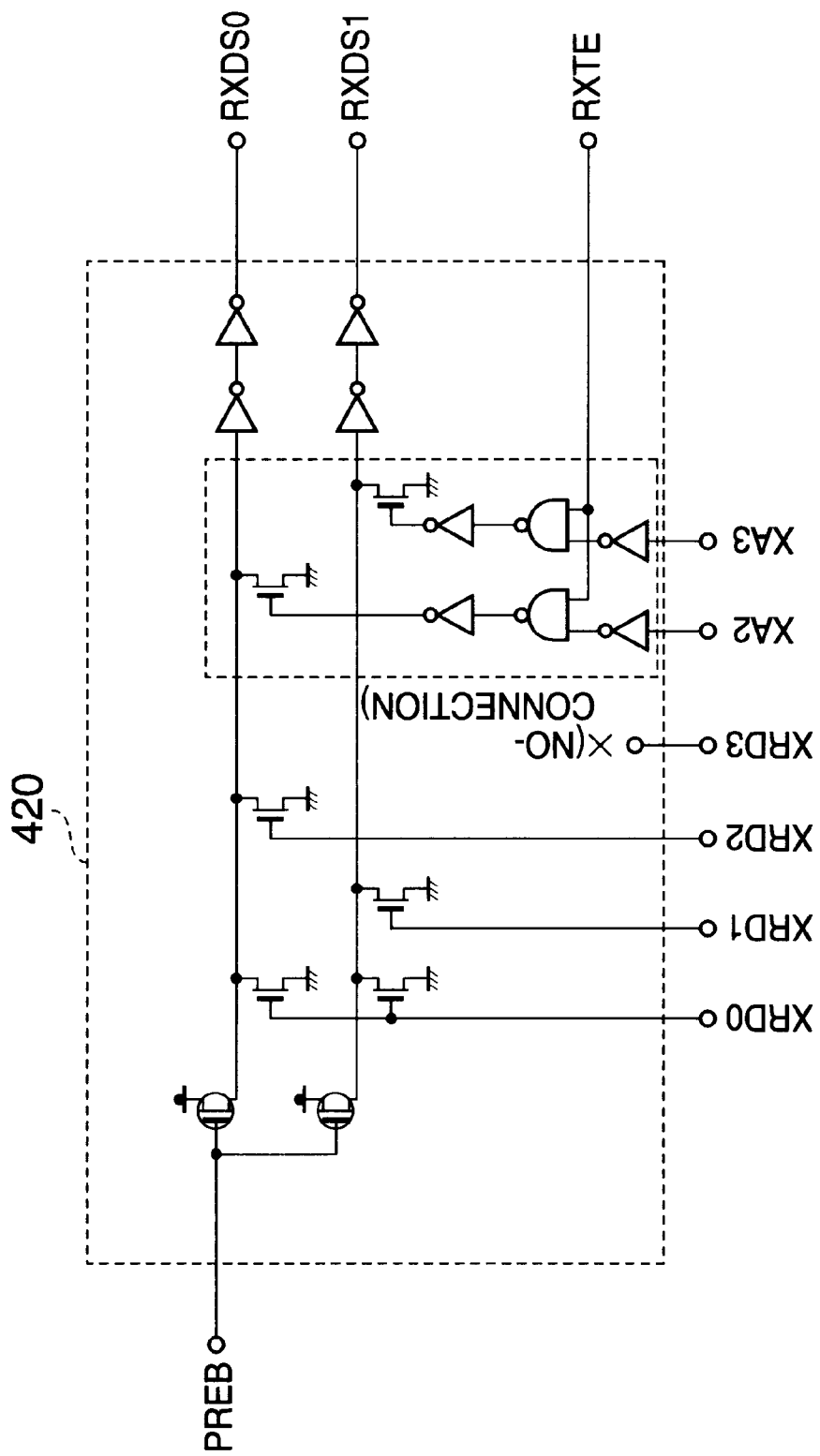
FIG. 7 is a circuit diagram showing another example of the redundancy main row encoder of the first embodiment of the present invention.

The redundancy encoder 420 of this embodiment may be constituted by a wired logic as shown in FIG. 7, instead of the circuit shown in FIG. 4. In such case, the precharge signal PRBE is used as the input signal.

Now, a second embodiment of the present invention will be described with reference to FIGS. 8 to 15.

Figure 8:
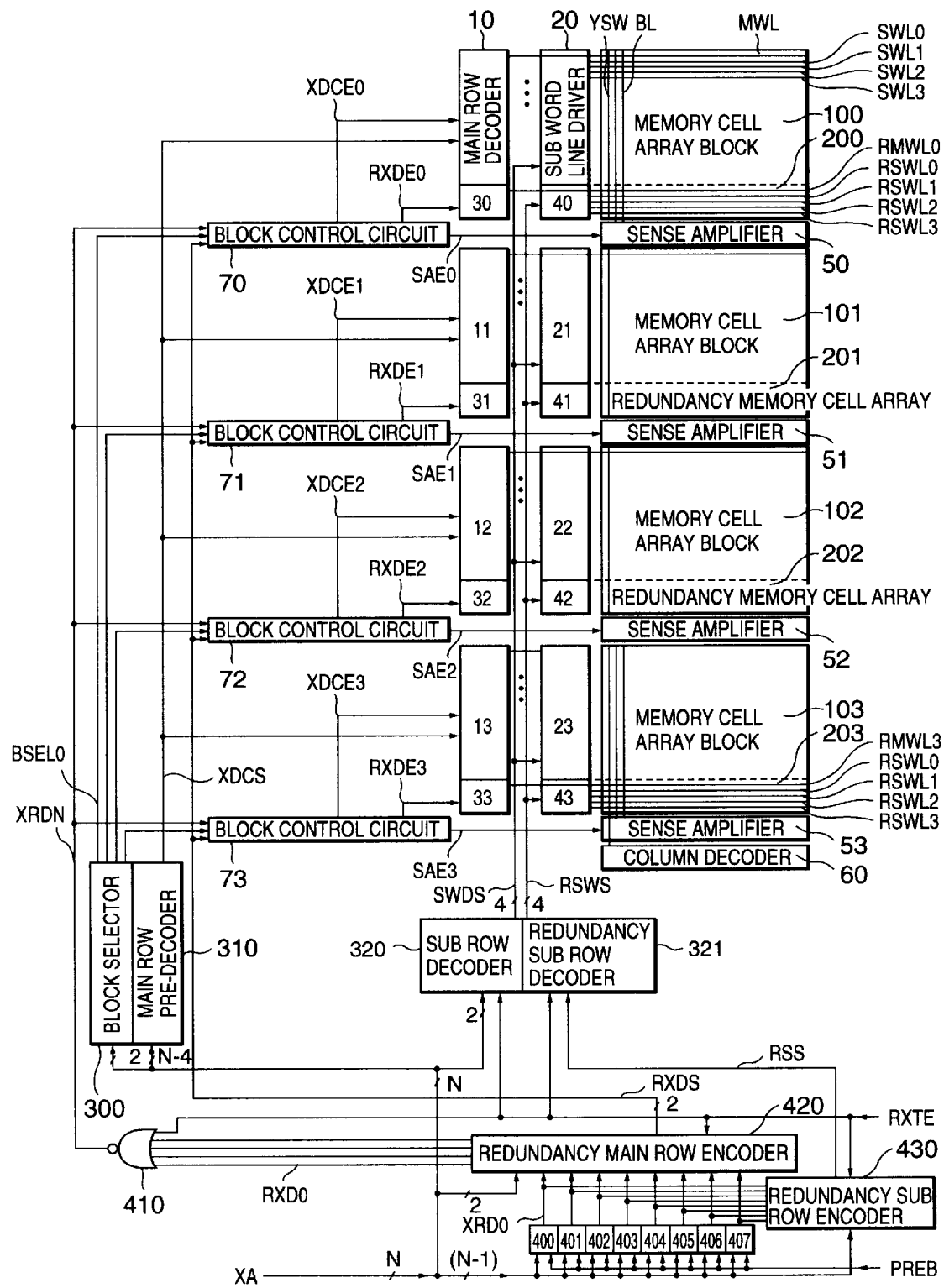
FIG. 8 is a block diagram showing a construction of a second embodiment of the present invention.

As shown in FIG. 8 which is a block diagram showing a construction of the second embodiment of the present invention, eight redundancy address program circuits 400 to 407 remedy defects of memory cell array blocks 100 to 103. That is, contrary to the first embodiment in which addresses input to the redundancy address program circuit are XA2~XAn-1, addresses are XA1~XAn-1 in the second embodiment, so that 2 sub word lines can be replaced by one redundancy address program circuit as a unit.

Figure 9:
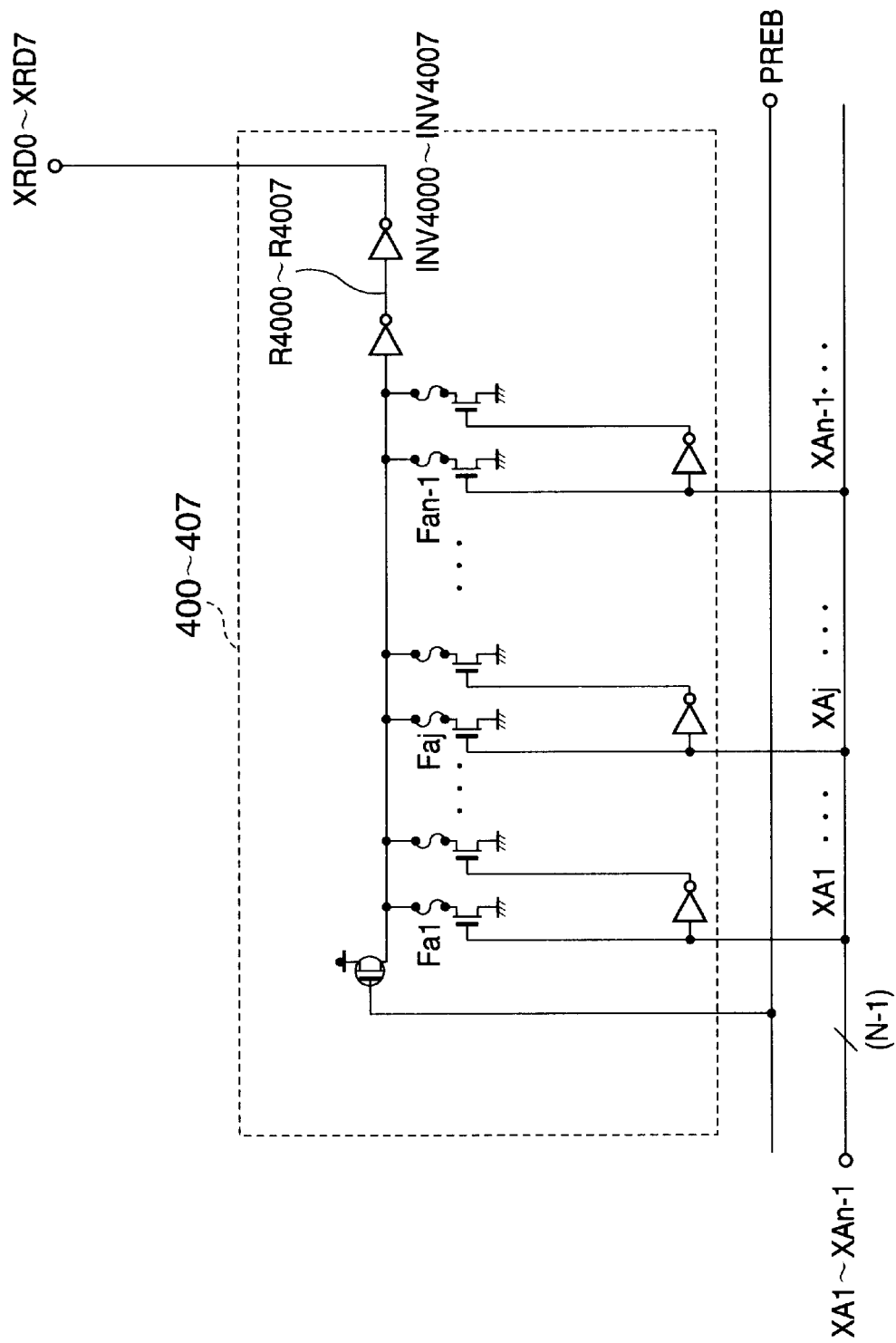
FIG. 9 is a circuit diagram showing a redundancy address program circuit of the second embodiment of the present invention.

The redundancy circuit test before fuses Fa1 to Fan-1 of redundancy address program circuits 400 to 407 shown in FIG. 9 are cut off is performed as described below. Since no fuse is cut off at a time of the redundancy circuit test, all of nodes R4000 to R4007 become "high" and all of redundancy selection signals XRD0 to XRD7 which are outputs of the redundancy address program circuits 400 to 407 become an inactive state, "low". Further, since a redundancy circuit test mode signal RXTE is "high", a redundancy judge signal XRDN from a redundancy judge circuit 410 shown in FIG. 8 becomes a redundancy state, "low". Therefore, all of main row decoders 10 to 13 become inactive by block control circuits 70 to 73.

Figures 10A, 10B:
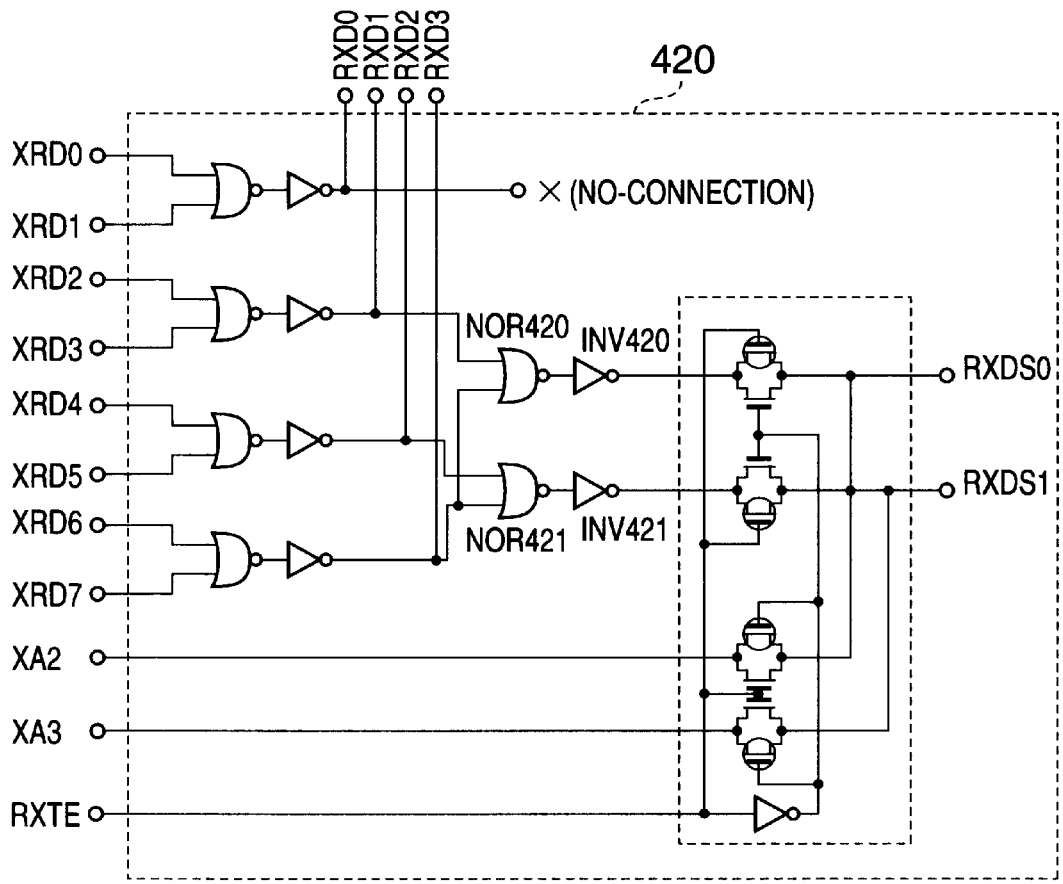
FIG. 10(a) is a circuit diagram of a redundancy main line encoder in the second embodiment of the present invention.
FIG. 10(b) shows signal correspondence tables of the redundancy main row encoder in the second embodiment of the present invention.

On the other hand, redundancy main row encode signals RXDS0 and RXDS1 determined by the correspondence table shown in FIG. 10(b) correspondingly to an input address (XA2, XA3) in the state of the redundancy circuit test mode signal RXTE is "high" are generated by a redundancy main row encoder shown in FIG. 10(a). In a case where the input address (XA2, XA3) is, for example, (0,0), a "low" redundancy state of a redundancy judge signal XRDN and "low" states of the encode signals RXDS0 and RXDS1 from the redundancy main row encoder 420 are decoded by a decode portion RDE 700 of a block control circuit 70 which is shown in detail in FIG. 3 and both a redundancy main row decoder activation signal RXDE0 and a sense amplifier activation signal SAE0 become an active level, "high". With this fact, a redundancy main word line RMWL0 of a redundancy memory cell array 200 shown in FIG. 8 is selected.

Figures 11A, 11B:
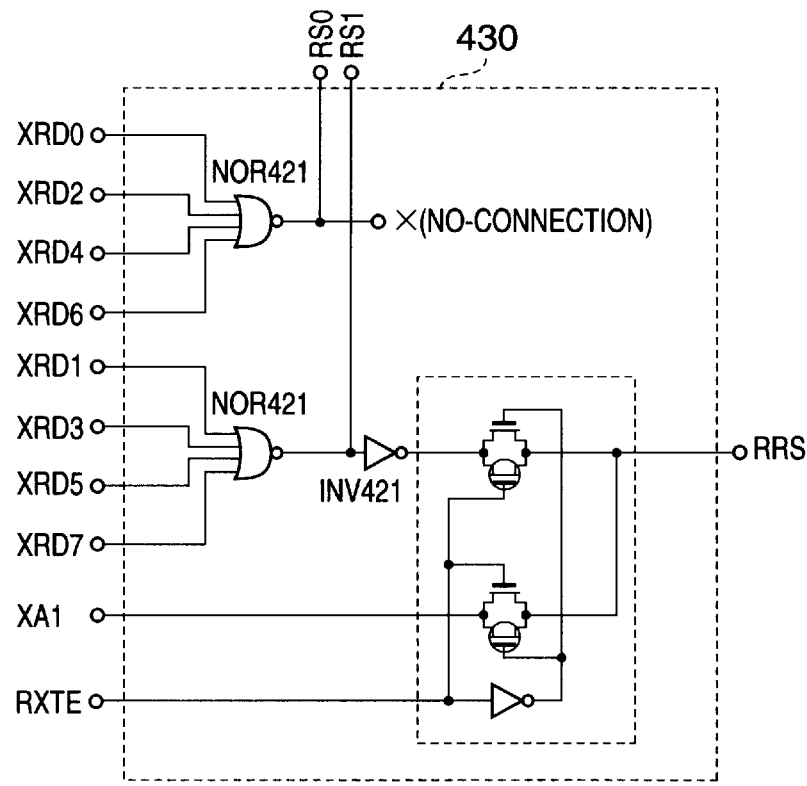
FIG. 11(a) is a circuit diagram showing a sub redundancy row encoder of the second embodiment of the present invention.
FIG. 11(b) shows signal correspondence tables of the redundancy sub row encoder in the second embodiment of the present invention.
Figure 12:
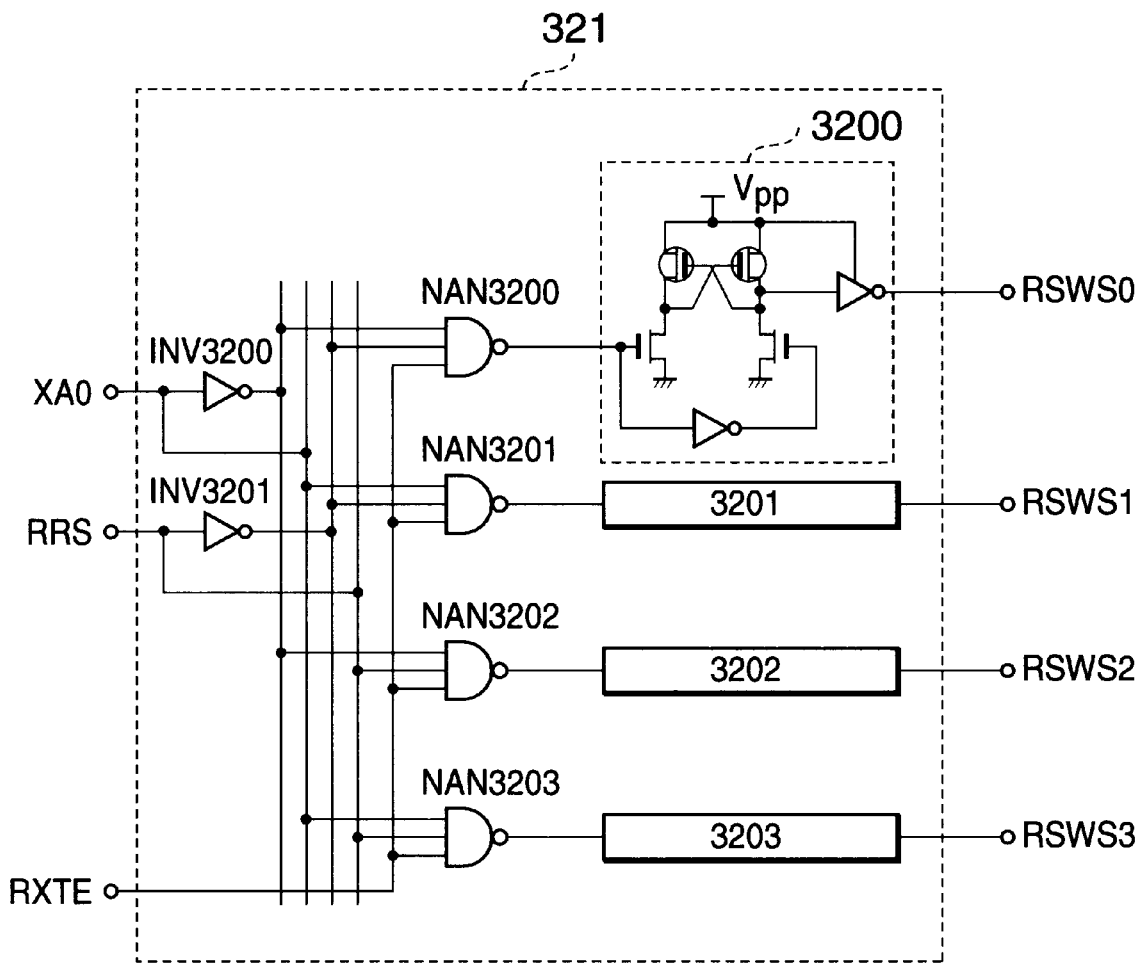
FIG. 12 is a circuit diagram showing a redundancy sub row decoder of the second embodiment of the present invention.
Figure 13:
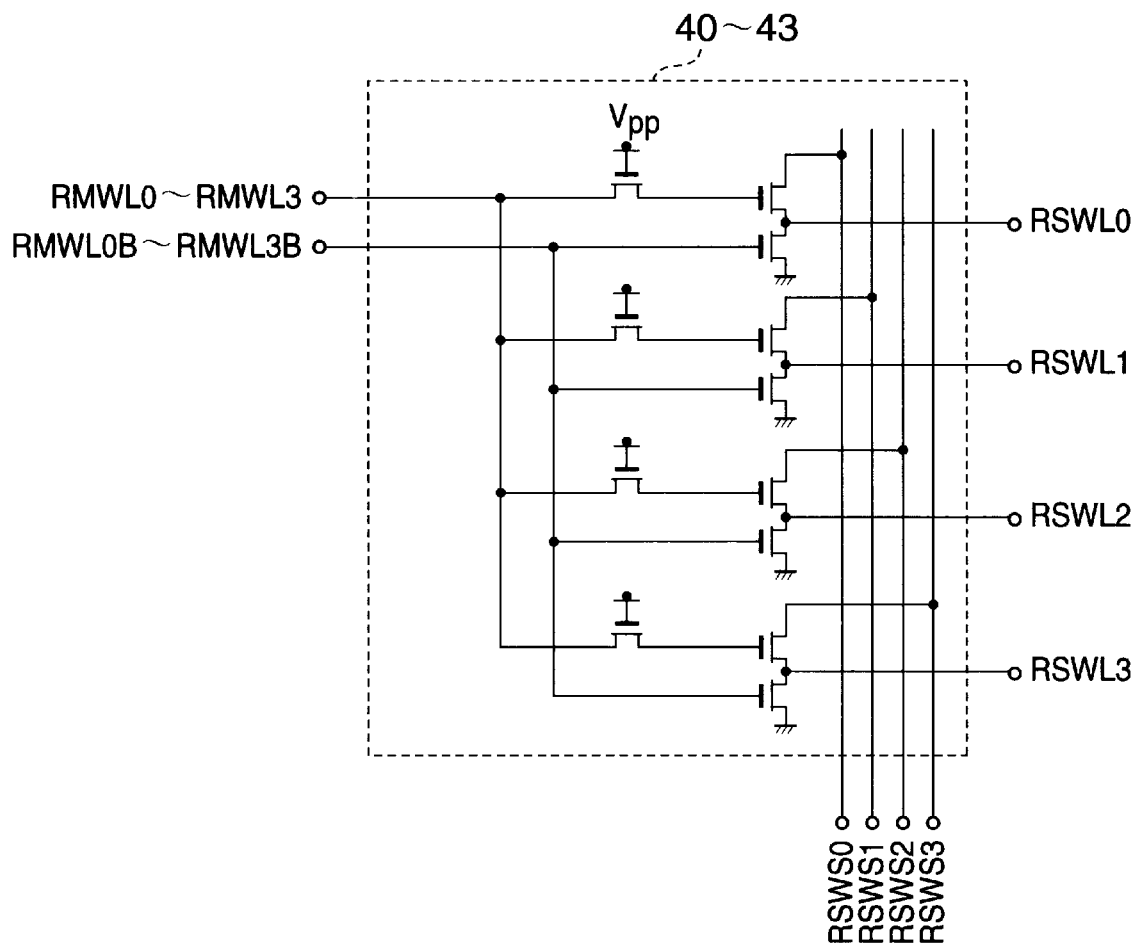
FIG. 13 is a circuit diagram showing another example of the redundancy sub word line driver of the second embodiment of the present invention.

On the other hand, in a sub row decoder 430 whose detail is shown in FIG. 11(a), the state of a redundancy sub row encode signal RRS is determined according to the correspondence table of the input address (XA1) when the redundancy circuit test mode signal RXTE shown in FIG. 11(b) is in "high" level. Thereafter, an address (XA0) of the least significant 1 bit and the redundancy sub row encode signal RRS are decoded by a redundancy sub row decoder 321 shown in FIG. 12 and one of sub word line driver selection signals SWDS0 to SWDS3 becomes "high". Therefore, in the redundancy sub word line driver 40 which is shown in detail in FIG. 13, one of the four redundancy main word lines RMWL0 to RMWL3 connected to the redundancy main word line RMWL0 is selected. In this example, one redundancy address program circuit performs a replacement of two sub word lines as a unit.

As mentioned above, it is possible to test the redundancy memory cell arrays by changing the address XA0 to XA3 while keeping the redundancy circuit test mode signal RXTE in "high" level.

An operation of this semiconductor memory device after some of the fuses are cut off when the redundancy circuit test mode signal RXTE is in "low" state will be described.

Since, when an address other than a address programmed by the cut-off of the fuses is input, all of the nodes R4000 to R4070 of the redundancy address program circuits 400 to 407 each shown in FIG. 9 become "high", all of the redundancy selection signals XRD0 to XRD7 from the redundancy address program circuits 400 to 407 become the inactive level, "low". Therefore, all of the redundancy main row decoder activation signals RXDE0 to RXDE3 of the block control circuits 70 to 73 become the inactive level, "low", since the output signal XRDN from the redundancy judge circuit 410 is kept in "high" which is a usual state. Thereafter, the usual memory cell array is selected by a similar operation to that of the first embodiment.

A case where a preliminarily address programmed to one of the redundancy address program circuits 400~407 is input will be considered. For example, it is assumed that the address programmed to the redundancy address program circuit 400is input. In such case, the node R4000 in the redundancy address program circuit 400 becomes "low" and the redundancy selection signal XRD0 of the redundancy address program circuit 400 becomes the active level, "high". Therefore, the redundancy judge signal XRDN from the redundancy judge circuit 410 becomes the redundancy state, "low", and all of the main row decoders 10 to 13 becomes inactive state by the block control circuits 70 to 73 as in the case where the redundancy circuit test mode signal RXTE is in the active-level, "high". On the other hand, the redundancy main row encode signals RXDS0 and RXDS1 determined by the redundancy main row encoder shown in FIG. 10(a), according the correspondence table shown in FIG. 10(b) with the redundancy circuit test mode signal RXTE being "low". Since the redundancy selection signal RXD0 is in "high" level, both the redundancy main row encode signals RXDS0 and RXDS become "low". The operation after the above is omitted since it is similar to that in the case where the redundancy circuit test mode signal is in the active, "low", level.

Figure 14:
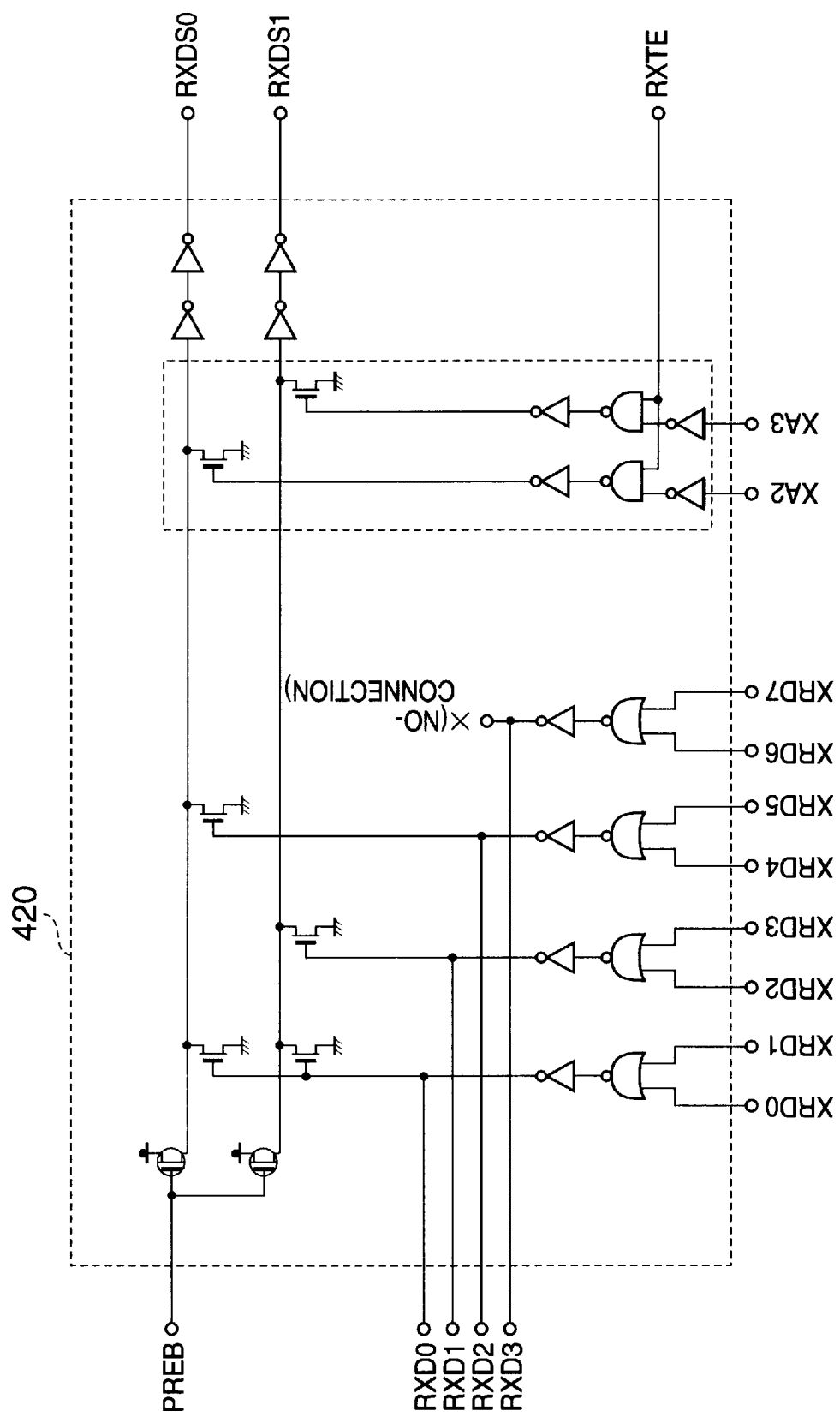
FIG. 14 is a circuit diagram showing another example of the redundancy main row encoder of the second embodiment of the present invention.
Figure 15:
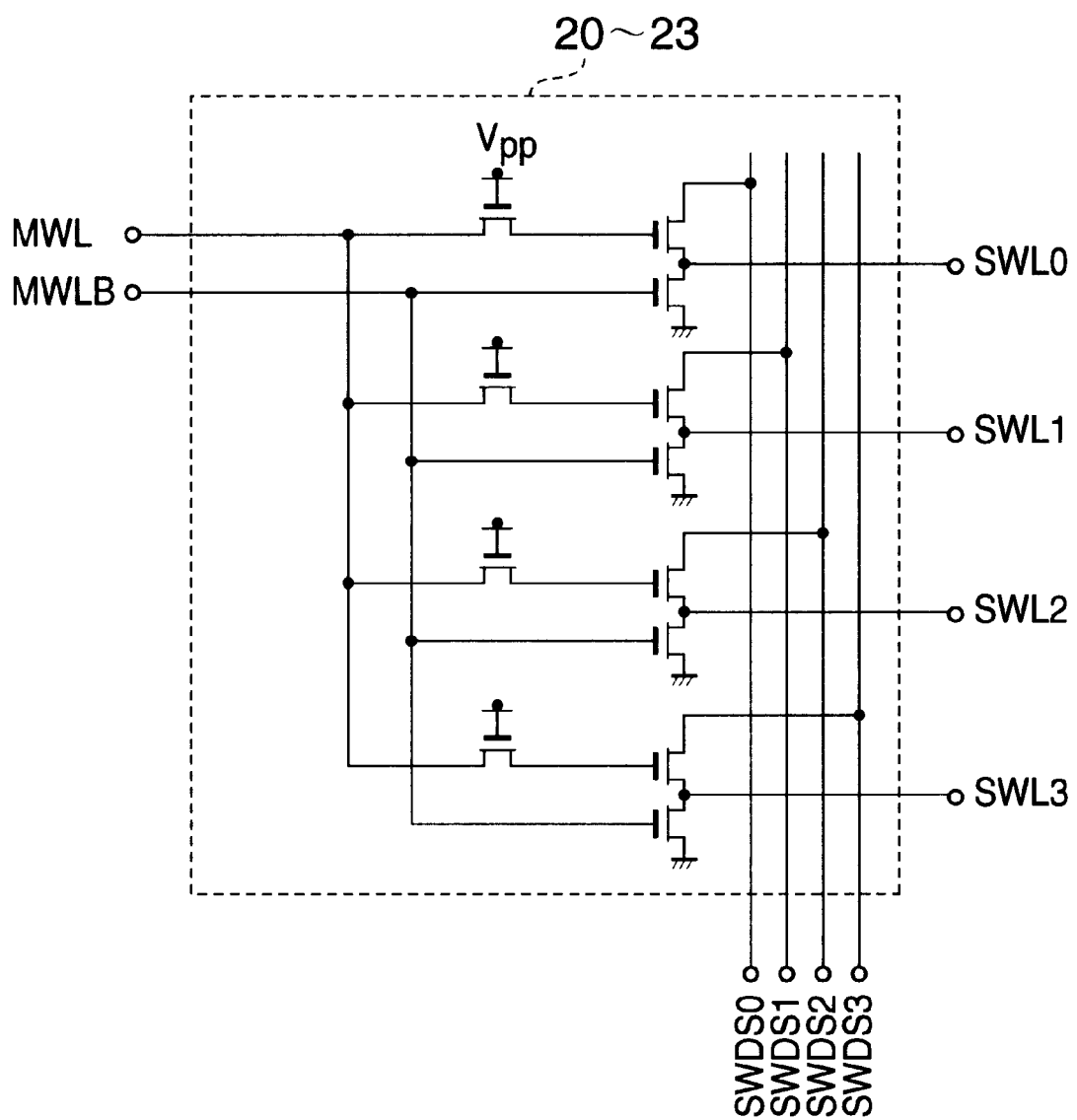
FIG. 15 is a circuit diagram showing a sub word line driver of the first and second embodiments of the present invention.

FIG. 14 shows the redundancy main row encoder 420 which is constructed by using a wired logic, instead of the circuit shown in FIG. 10, and the operation thereof is similar to that of the circuit shown in FIG. 10. Further, the redundancy sub row line encoder 430 may be constructed by using a wired logic.

As described hereinbefore, in the semiconductor memory device of the present invention, it is unnecessary to add fuses and gate circuits, etc., to each of the redundancy address program circuits as in the prior art.

According to the semiconductor memory device of the present invention, a redundancy memory cell is selected by using a portion of the input address when the redundancy circuit test mode signal is in active level and by the redundancy selection signal from the redundancy address program circuit when the redundancy circuit test mode signal is in inactive state. Therefore, it is possible to preliminarily test the redundancy memory cell without substantial increase of the chip area.

Although the present invention has been described with reference to the embodiments for the redundancy row, it is possible to embody the present invention by changing the redundancy row and the row address signal to a redundancy column and a column address signal, respectively.

It is apparent that the present invention is not limited to the above embodiments, but may be modified and changed without departing from the scope and spirit of the invention.

What is claimed is:

1. A semiconductor memory device comprising:
   a plurality of redundancy address program circuits for programming respectively such that a redundancy memory cell in a redundancy memory cell array is selected when an address for selecting a defective memory cell is input, each of said plurality of redundancy address program circuits generating a redundancy selection signal which is made active when an address programmed to each of said plurality of redundancy address program circuits is input; and
   a control circuit for receiving a redundancy circuit test mode signal for selecting a redundancy memory cell and testing when said test mode signal is made active, thereby determining whether said selected redundancy memory cell is defective before said redundancy address program circuit is programmed, said control circuit generating a portion of an input address as a portion of the address of said redundancy memory cell when said test mode signal is in said active state and generating signals produced from said redundancy selection signals as said portion of the address of a redundancy memory cell when said test mode signal is in an inactive state.

2. The semiconductor memory device as claimed in claim 1, wherein said control circuit has a encoder, said encoder encoding said redundancy selection signals of said plurality of redundancy address program circuits to generate redundancy encode signals as said portion of the address of said redundancy memory cell when said redundancy circuit test mode signal is in said inactive state, said encoder generating said portion of said input address as said redundancy encode signals when said redundancy circuit test mode signal is in said active state.

3. A semiconductor memory device comprising means for preliminarily testing a redundancy memory cell array to determine whether said redundancy memory cell array is defective before said redundancy address program circuit is programmed, said means for preliminarily testing selecting a redundancy memory cell row of said redundancy memory cell array by a portion of input address bits, and means for selecting and using a non-defective redundancy memory cell array instead of a memory cell array when said memory cell array is defective.

4. A semiconductor memory device comprising means for preliminarily testing a redundancy memory cell array to determine whether said redundancy memory cell array is defective, said means for preliminarily testing selecting a redundancy memory cell column of said redundancy memory cell array by a portion of input address bits, and means for selecting and using a non-defective redundancy memory cell array in lieu of a memory cell array when a defect exists in said memory cell array.

5. The semiconductor memory device as claimed in claim 2,
   wherein said redundancy memory cell array is divided into a plurality of redundancy memory cell array blocks,
   said control circuit further having a plurality of block control circuits, each of which is connected to associated one of said plurality of redundancy memory cell array blocks, said redundancy encode signals input to said plurality of block control circuits,
   wherein one of said plurality of block control circuits becomes active to select associated one of said redundancy memory cell array blocks according to said redundancy encode signals when one of said redundancy circuit test mode signal and said redundancy selection signals is in said active state.

6. A semiconductor memory device comprising:
   a redundancy address program circuit which selects a redundancy memory cell in respect to an address for selecting a defective memory cell when said redundancy address program circuit is programmed, said redundancy address program circuit generating a redundancy selection signal which is made active when said address programmed to said redundancy address program circuit is input; and
   a control circuit for selecting and testing a redundancy memory cell, thereby determining whether said selected redundancy memory cell is defective before said redundancy address program circuit is programmed, said control circuit selecting said redundancy memory cell by using a portion of an input address when said redundancy memory cell is tested and selecting a redundancy memory cell by using said redundancy selection signal when said redundancy memory cell is not tested.

* * * * *